(12) United States Patent
Boerkekamp et al.

(10) Patent No.: US 8,728,835 B2
(45) Date of Patent: May 20, 2014

(54) LIGHT SCATTERING BY CONTROLLED POROSITY IN OPTICAL CERAMICS FOR LEDS

(75) Inventors: Jacobus Gerardus Boerkekamp, Eindhoven (NL); Oliver Steigelmann, Eindhoven (NL); Henricus Albertus Maria Van Hal, Vessem (NL); Johannes Francisucs Maria Cillessen, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 451 days.

(21) Appl. No.: 12/811,832

(22) PCT Filed: Jan. 9, 2009

(86) PCT No.: PCT/IB2009/050086
§ 371 (c)(1),
(2), (4) Date: Jul. 7, 2010

(87) PCT Pub. No.: WO2009/090580
PCT Pub. Date: Jul. 23, 2009

(65) Prior Publication Data
US 2010/0276717 A1    Nov. 4, 2010

(30) Foreign Application Priority Data
Jan. 15, 2008    (EP) ..................................... 08150250

(51) Int. Cl.
*H01L 21/00*    (2006.01)
*H01L 33/50*    (2010.01)

(52) U.S. Cl.
CPC ................................... *H01L 33/502* (2013.01)
USPC ............................................................ 438/29

(58) Field of Classification Search
CPC ...................................................... H01L 33/502
USPC ............................................................ 438/29
See application file for complete search history.

(56) References Cited

U.S. PATENT DOCUMENTS

| | | |
|---|---|---|
| 6,773,825 B2 | 8/2004 | Pickrell et al. |
| 6,791,259 B1 | 9/2004 | Stokes et al. |
| 2002/0149128 A1 | 10/2002 | DiChiara, Jr. |
| 2002/0197456 A1* | 12/2002 | Pope .............................. 428/209 |
| 2004/0104672 A1 | 6/2004 | Shiang et al. |
| 2004/0145308 A1 | 7/2004 | Rossner et al. |
| 2005/0181197 A1 | 8/2005 | Masuyama et al. |

FOREIGN PATENT DOCUMENTS

| | | |
|---|---|---|
| EP | 1595857 A1 | 11/2005 |
| WO | 2006097876 A1 | 9/2006 |
| WO | 2007107915 A1 | 9/2007 |
| WO | 2007107917 A2 | 9/2007 |

* cited by examiner

*Primary Examiner* — William D Coleman

(57) ABSTRACT

The present invention relates to a light emitting device (100) comprising at least one light emitting diode (101) and at least one porous ceramic element (102), which ceramic element (102) is arranged to receive light from the light emitting diode(s) (101). The present invention also relates to methods for the manufacture of the light emitting device (100) and of the porous ceramic element (102).

12 Claims, 3 Drawing Sheets

US 8,728,835 B2

LIGHT SCATTERING BY CONTROLLED POROSITY IN OPTICAL CERAMICS FOR LEDS

TECHNICAL FIELD

The present invention relates to a light emitting device comprising at least one light emitting diode and at least one porous ceramic element comprising at least one wavelength converting material, said ceramic element being arranged to receive light from said light emitting diode; and to a method for the manufacture of the device and the porous ceramic element.

BACKGROUND OF THE INVENTION

Semiconductor light emitting devices comprising light emitting diodes (LEDs) are among the most efficient and robust light sources currently available. Illumination requires white color light sources, in particular white light sources of high color rendering properties. Various attempts have been made to make white light emitting illumination systems by using LEDs as radiation sources.

One method of obtaining white light is to use blue LEDs and convert part of the emitted light to yellow light (wavelength spectrum at about 580 nm) via wavelength converting materials, such as for example modified YAG:Ce based phosphors. Since yellow light stimulates the red and green receptors of the eye, the resulting mix of blue and yellow light gives the appearance of white.

Typically, this is done by arranging a phosphor-containing material, i.e. a wavelength converting material on the LED such that part of the light emitted by the LED is absorbed by the phosphors and is emitted as light of a wavelength different from that of the absorbed light.

However, one problem associated with such an arrangement is the color homogeneity of the light provided. The conversion strength of the wavelength converting material is controlled by the activator content (e.g. Ce as in YAG:Ce) and the path length of the blue light which travels through the ceramic element. This path is dependent on the thickness and scattering of the wavelength converting material. Typically, the ceramic element guides the blue light towards the edges. Since in this direction the path length is much longer than if the light emerges in a vertical direction, a higher conversion ratio is obtained and this results in the formation of a so called "yellow ring" when looking at larger angles.

In order to solve the problem of the formation of a yellow ring and to obtain a homogenous color impression, scattering must be introduced in the ceramic element.

WO 2006/097876 describes the use of a phosphor in a polycrystalline ceramic structure and a light-emitting element provided with the same comprising an LED in which a composite structure of phosphor particles is embedded in a matrix comprising a polycrystalline ceramic alumina.

WO 2006/097876 states that color homogeneity may be achieved by introducing pores and second phases that introduce light scattering. The porosity should not exceed 1% and the pore sizes should be kept small, e.g. smaller than 300 nm, preferably below 50 nm.

In ceramics, porosity is conventionally obtained by stopping sintering in an intermediate stage of the process in order to avoid the formation of a stable, fully densified ceramic body. Inherent to such a process, the control of a specific porosity level is difficult as a small temperature difference can cause large density (and porosity) variations having consequences for color conversion strength and thus color homogeneity. Such ceramic elements are inappropriate for mass production.

Hence, there is a need in the art to provide a light emitting device which prevents the formation of a yellow ring around the device, and which allows for a more controlled and robust process to achieve the desired porosity during manufacturing, the device being easy and inexpensive to manufacture allowing for mass production.

SUMMARY OF THE INVENTION

One object of the present invention is to at least partly fulfill the above mentioned need and to provide a light emitting device that emits light with a high color homogeneity, especially where the out-coupling of light resulting in the formation of a yellow ring around the light emitting device is avoided.

Another object of the present invention is to provide such a light emitting device, which is easy and inexpensive to manufacture, thereby enabling mass production of such light emitting devices.

These and other objects of the present invention are achieved by a light-emitting device and methods for their production according to the appended claims.

Thus, in a first aspect the present invention relates to a light-emitting device comprising at least one light emitting diode and at least one porous ceramic element. The porous ceramic element comprises at least one wavelength converting material and is arranged to receive light from the light emitting diode(s). The ceramic element has an average pore diameter of from 2 µm to 10 µm.

In a device of the present invention, light that is emitted by the LED at oblique angles will enter the porous ceramic element and be scattered by the pores provided therein. The pores function as scattering centers, and as a result blue primary radiation and yellow secondary radiation are mixed homogenously. Hence, a homogenous color impression is obtained, and the formation of a yellow ring at the edges of the device is prevented.

An average pore diameter range of from 2 µm to 10 µm provides the desired scattering, thereby resulting in a homogenous light emission. Another advantage with this average pore diameter range is that a controlled porosity may be obtained during the sintering stage of the manufacturing process. Usually this is a critical step, since smaller pores than those of the described range are difficult to maintain in the ceramic body after sintering.

In embodiments of the invention, the ceramic element is formed from ceramic particles having an average particle size of 5 µm to 10 µm.

For ceramic elements formed from ceramic particles having the above mentioned particle size, the average pore diameter is preferably higher than 2 µm. This is due to the fact that the maintenance of porosity during sintering is difficult and troublesome since pores smaller than about 2 µm are difficult to maintain. On the other hand, if the average diameter exceeds 10 µm a large degree of light is scattered in a backwards direction, i.e. towards the light emitting diode(s) such that the light output efficiency is reduced.

Hence, the pore average diameter of from 2 µm to 10 µm according to the present invention provides for a compromise between the color homogeneity achieved and the light efficiency which is reduced due to backscattering.

The scattering obtained with pores of the above mentioned average diameter range results in an enhanced conversion of blue light into yellow light such that color homogeneity over angle and light emission efficacy is still sufficient.

Preferably, the pore diameter of said ceramic element is from 2 μm to 5 μm. Within this range, the light loss due to back scattering is further reduced.

In one embodiment of the present invention, the porosity of the ceramic element is in the range of from 1.5 to 5% by volume. A porosity within this range may be easily obtained during manufacturing and remains constant during final stage sintering. Furthermore, a porosity interval of from 1.5 to 5% results in the desired scattering and the prevention of a yellow ring around the light emitting device.

In a second aspect, the present invention relates to a method for manufacturing a light emitting device comprising:

providing a slurry comprising ceramic particles of at least one wavelength converting material and polymeric particles having a diameter of from 2 μm to 10 μm;

forming a ceramic body from said slurry;

removing said polymeric particles from said ceramic body to provide a porous ceramic element having an average pore diameter of from 2 μm to 10 μm; and arranging said porous ceramic element to receive light from at least one light emitting diode.

The method according to the invention is easy to carry out, and inexpensive, thereby enabling mass production of light emitting devices.

An important advantage with the method according to the invention is that it targets the desired scattering by controlling the porosity of the sintered ceramic body. Accordingly, a controlled porosity can be achieved by final stage sintering avoiding the necessity to use partial sintering.

The method according to the invention makes is possible to exactly steer the porosity (and scatter) to the amount required.

In embodiments of the invention, the ceramic particles have an average particle size of from 5 μm to 10 μm.

In a preferred embodiment of the invention, the polymeric particles have an average pore diameter of from 2 μm to 5 μm providing pores in the ceramic element having essentially the same average diameter. Within this range, less light is lost due to back scattering.

In embodiments, the polymeric particles comprise e.g. polystyrene or polyacrylate. Such polymers can be easily dispersed and are completely removable upon thermal treatment.

In the method above, the polymeric particles are removed by subjecting said ceramic (green) body to a thermal treatment at a temperature up to 1000° C. Thereby, the polymeric particles and binder material, if any, are removed from the ceramic body.

The porous ceramic element obtained in step (c) may then be subjected to a thermal treatment at a temperature above 1000° C. such that a stable and to a maximum densified porous ceramic element having an average pore diameter of from 2 μm to 10 μm is provided. During this process stage, the mixture is sintered such that the ceramic particles are fused together. Hence, a final ceramic element comprising pores having an average pore diameter of from 2 μm to 10 μm is thereby provided, said porous ceramic element being robust and densified to its maximum.

Thus, the present invention provides a very robust process to achieve the desired porosity, and consequently a tuned scattering level in the sintered ceramic phosphor can be realized.

In a third aspect the present invention relates to the manufacture of a ceramic element comprising:

providing a slurry comprising ceramic particles of at least one wavelength converting material and polymeric particles having a diameter of from 2 μm to 10 μm;

forming a ceramic body from said slurry; and removing said polymeric particles from said ceramic body to provide a porous ceramic element having an average pore diameter of from 2 μm to 10 μm Such a ceramic element may be manufactured beforehand and later on be arranged on light emitting diodes to form light emitting devices. This facilitates mass-production of the light emitting devices of the present invention.

These and other aspects of the invention will be apparent from and elucidated with reference to the embodiment(s) described hereinafter.

DETAILED DESCRIPTION OF THE EMBODIMENTS

The present invention relates to a light emitting device comprising at least one light emitting diode and at least one porous ceramic element comprising at least one wavelength converting material and the methods for the manufacture of the light emitting device and the porous ceramic element.

Figure 1:
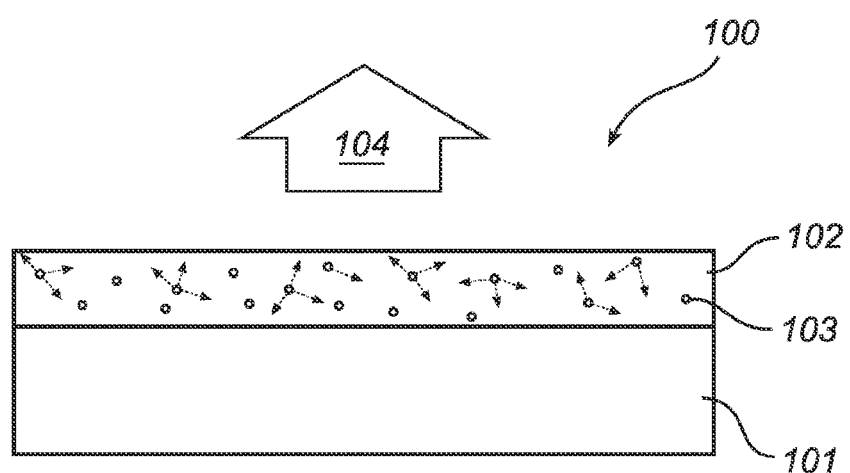
FIG. 1 is a schematic view illustrating a light emitting device according to the present invention

One embodiment of a light emitting device 100 according to the present invention is illustrated in FIG. 1. The light emitting device 100 comprises at least one light emitting diode 101 and at least one porous ceramic element 102. The porous ceramic element 102 is arranged to receive light from the light emitting diode 101. The ceramic element 102 has a ceramic microstructure characterized by an average pore diameter of from 2 μm to 10 μm.

The porous ceramic element 102 receives light emitted by the light emitting diode(s) 101 and converts it into light of a longer wavelength.

The porous ceramic element 102 serves as a wavelength converting element, and is self-supporting. Such a self-supporting ceramic element can be mass produced in bulk, complete with the pores comprised therein, and may then at a later stage be arranged on the light emitting device of the invention. Furthermore, the ceramic element is temperature, oxidation and radiation stable and will not deteriorate when exposed to heat, oxygen and/or light. The ceramic element of the present invention has a high refractive index increasing the coupling of light into the wavelength converting element.

Typically the porous ceramic element is essentially translucent.

Preferably, the LED 101 is a blue light emitting LED, and the ceramic element is adapted to absorb blue light, while emitting yellow light. The combined emission of non-converted blue LED emission and the yellow-converted light gives a white impression.

Upon contact with the pores 103 in the ceramic body, light will be scattered in different directions (illustrated by the arrows in FIG. 1) and the emerging light 104 has been efficiently converted by the wavelength converting material in the porous ceramic element 103 such that a homogenous color impression is obtained.

In embodiments of the invention, the ceramic element is formed from ceramic particles having an average particle size of 5 µm to 10 µm.

The average diameter of the pores 103 should thus be within the range of from 2 µm to 10 µm. If the pores are too small, i.e. less than about 2 µm, it is difficult for the ceramic element to remain stable, i.e. to retain the pores during the final stage of the manufacturing process, which is sintering at a high temperature. Pores with an average diameter below 2 µm are likely to disappear during this stage.

However, if the pores 103 are too large, i.e. larger than 10 µm, the light emitted by the LED 101 might be scattered in a backward direction, i.e. in a direction towards the light emitting diode(s) 101 resulting in the loss of light and efficiency of the device.

Accordingly, it is fundamental to find a compromise between the color homogeneity achieved by increasing the number and size of the pores and the light efficiency which is reduced due to backscattering.

Figures 2A, 2B:
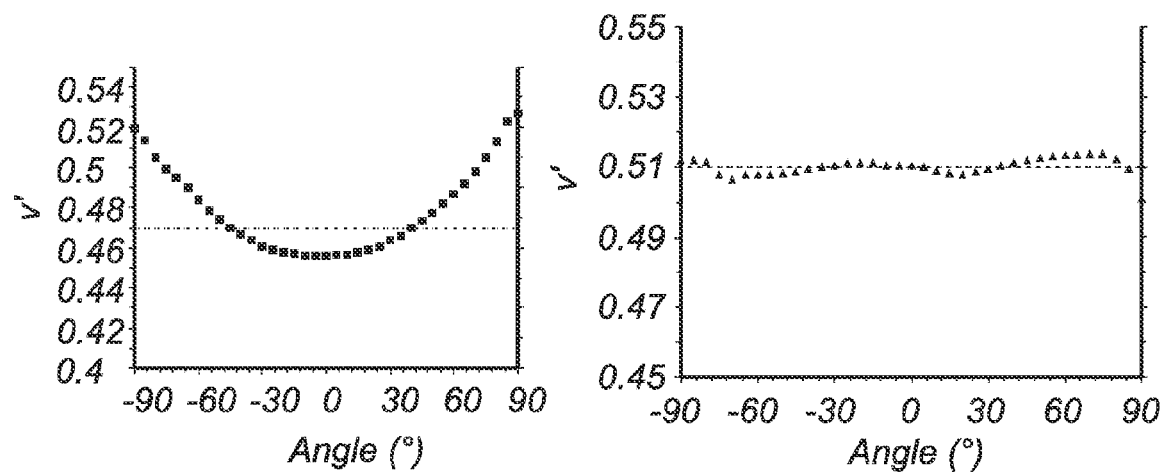
FIG. 2 shows the deviation of the color coordinate v' as a function of the angle of observation for a light emitting device comprising a conventional ceramic element (FIG. 2a) compared to the inventive light emitting device comprising a porous ceramic element (FIG. 2b).

The above mentioned targeted average pore diameter range of 2 µm to 10 µm solves this problem and is optimal for scattering while maintaining the pores within the ceramic element during manufacturing. Accordingly, the formation of a yellow ring is also prevented, which is illustrated in FIG. 2.

A light emitting device comprising a porous ceramic element provides an almost constant value of the color coordinate v' over the angle of observation (FIG. 2a) whereas a light emitting device comprising a conventional ceramic element is characterized by a higher v' (the color appears more yellowish) at large angles.

The porous ceramic element of the light emitting device according to the invention can be exactly tuned and controlled during the ceramic manufacturing procedure.

In a preferred embodiment, the average pore diameter of the porous ceramic element is from 2 µm to 5 µm. Within this range, less light is lost due to back scattering.

In embodiments of the invention, the porosity of the ceramic element is between 1.5 to 5%. A porosity within this range may be easily obtained during manufacturing and remains constant during final stage sintering. Furthermore, a porosity interval of from 1.5 to 5% results in the desired scattering and the prevention of a yellow ring around the light emitting device.

As used herein the term "porosity" is defined as a unitless number representing the proportion of the total volume of an article which is occupied by pores.

The ceramic element of the present invention may comprise any wavelength converting material conventionally used in the art. Typically a phosphor of the yttrium aluminium garnet (YAG, base formula: $Y_3Al_5O_{12}$) type doped with $Ce^{3+}$ is used. Preferably, the wavelength converting material is an inorganic wavelength converting material. Examples include, but are not limited to YAG:Ce, YAG(Gd):Ce (base formula: $(Y,Gd)_3Al_5O_{12}$), LuAG:Ce (base formula: $Lu_3Al_5O_{12}$), Sr—SiNO:Eu (oxynitride phosphor) or (BaSr)SiN:Eu (nitride phosphor) based materials and any combination of two or more thereof.

In embodiments, the ceramic element comprises more than one wavelength converting material.

The term "wavelength converting material" as is used herein, refers to a material that absorbs light of a first wavelength resulting in the emission of light of a second, longer wavelength. Upon absorption of light, electrons in the material become excited to a higher energy level. Upon relaxation back from the higher energy levels, the excess energy is released from the material in form of light having a longer wavelength than of that absorbed. Hence, the term relates to both fluorescent and phosphorescent wavelength conversion.

The present invention also relates to a method for the manufacture of a light emitting device comprising:
  providing a slurry comprising ceramic particles of at least one wavelength converting material and polymeric particles having a diameter of from 2 µm to 10 µm;
  forming a ceramic body from said slurry;
  removing said polymeric particles from said ceramic body to provide a porous ceramic element having an average pore diameter of from 2 µm to 10 µm; and
  arranging said porous ceramic element to receive light from at least one light emitting diode.

In the present invention, said slurry is provided by mixing ceramic particles of wavelength converting material and polymeric particles having an average diameter of from 2 µm to 10 µm, and, if required, any other suitable agent, such as a binder, a dispersant, an antifoam agent, a release agent and/or a plasticizer. The average size of the ceramic particles is typically from 5 µm to 10 µm.

As mentioned previously an average pore diameter within the range of from 2 µm to 10 µm is preferred since this allows for the desired scattering effect within the porous ceramic element and for the porosity of the device to be controlled during manufacturing. Conventional methods of stopping the sintering in an intermediate stage of the manufacturing process do not allow the control of the specific porosity level or the specific average pore diameter. This is due to the fact that a small temperature difference during firing can cause large variations in porosity having consequences for color homogeneity. Partial sintering, for instance by reducing the sinter temperature, can lead to a large variation in porosity in a sintered batch of samples and even over a single sample due to temperature gradients typical for industrial sintering furnaces.

Polymeric particles having an average diameter of from 2 µm to 5 µm form a particularly preferred embodiment of the invention.

In embodiments of the present invention, the polymeric particles comprise polystyrene or polyacrylate, but the present invention is not limited thereto. Any polymer, which may be suspended in water or an organic solvent, can be used in the present invention.

A ceramic body is thereafter formed by first granulating the ceramic slurry comprising the polymeric particles and then forming a ceramic body, i.e. a wafer comprising ceramic wavelength converting material. Any conventional method of forming such a ceramic wafer may be used, e.g. pressing, slip casting, tape casting, roller pressing, extruding or injection moulding.

Optionally, the ceramic wafer may be dried to remove any liquid remaining in the ceramic body.

The polymeric particles are thereafter removed by subjecting the ceramic (green) body to a thermal treatment. The term "removing" polymeric particles means that the polymeric particles are decomposed or oxidized as a result of the thermal treatment. Hence, they essentially disappear from the ceramic body leaving open pores in their place.

Figure 3:
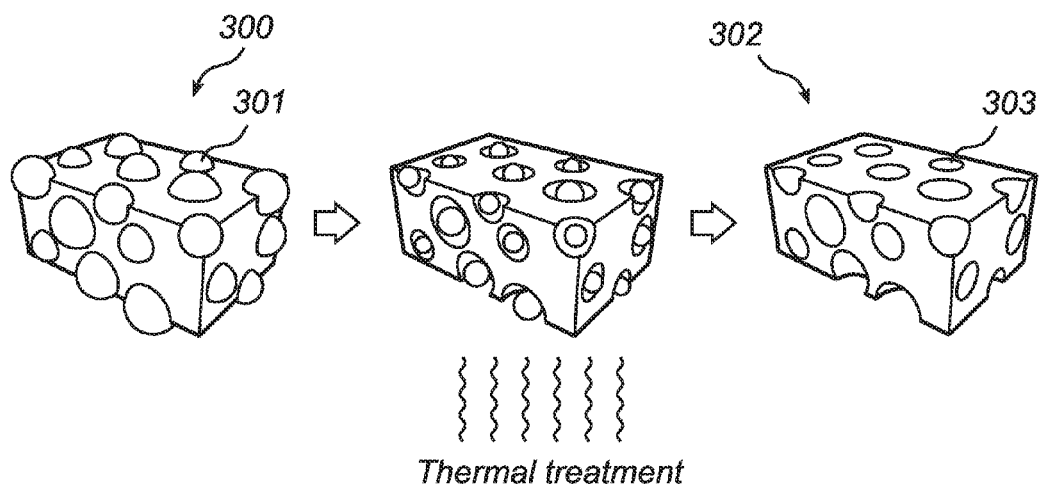
FIG. 3 illustrates the method of manufacturing a light emitting device according to the invention.

As is illustrated in FIG. 3, the ceramic body, i.e. the ceramic wafer 300 comprising polymeric particles 301 is subjected to a thermal treatment such that a porous ceramic element 302 is provided. The porous ceramic element 302 comprises pores 303 having an average pore diameter of from 2 µm to 10 µm. These pores remain after the thermal treatment.

Typically, this thermal treatment is performed at a temperature up to 1000° C., preferably at a temperature up to 500° C. dependent on the decomposition or oxidation temperature of the polymer used. During this step, the polymeric particles 301 and any binding material added in the above mentioned process are removed from the ceramic body 300 providing pores 303 having an average pore diameter of from 2 µm to 10 µm, typically of from 2 µm to 5 µm.

The method according to the invention typically comprises the additional step of subjecting said porous ceramic element to a thermal treatment at a temperature above 1000° C. after step (c). Upon this thermal treatment, a robust and to the maximum densified porous ceramic element comprising wavelength converting material is provided. Typically, this thermal treatment is performed at a temperature above 1000° C., e.g. between 1600° C. and 1700° C. for YAG:Ce. During this process step the ceramic body is sintered such that the ceramic particles are fused together, thereby providing the final porous ceramic element which is robust and densified to its maximum value. The second thermal treatment, i.e. the sintering may be performed e.g. in air or in a nitrogen atmosphere or any other suitable sintering atmosphere.

Figures 4A, 4B:
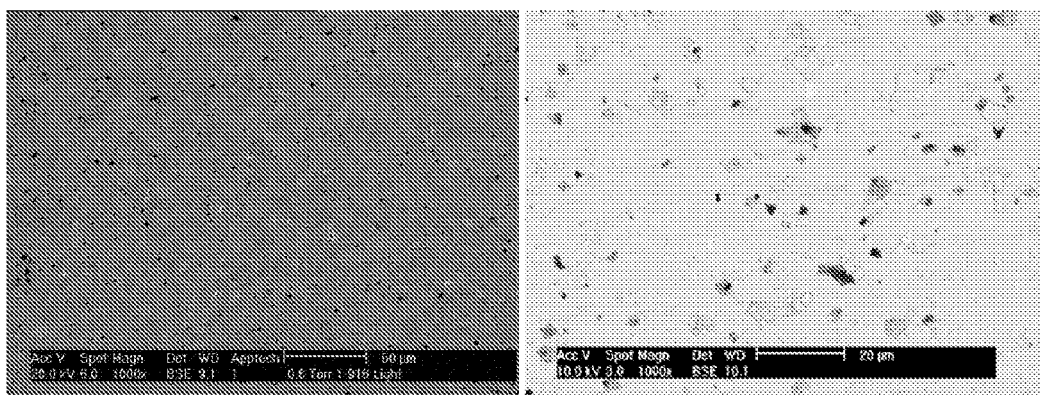
FIG. 4a illustrates the microstructure of a ceramic element after sintering which has not been subjected to the inventive manufacturing method.
FIG. 4b illustrates the microstructure of a ceramic element after sintering which has been subjected to the inventive manufacturing method.

FIG. 4 illustrates the differences in a microstructure of a ceramic element which has been subjected to the inventive method (FIG. 4b) compared to conventional sintering without the use of polymeric particles (FIG. 4a). As can be seen in FIG. 4b, the pores remain after the sintering step.

Thereafter, the wafers may be ground to the desired thickness and may also be diced into a plurality of porous ceramic elements.

The porous ceramic element is then arranged on at least one light emitting device, i.e. arranged to receive light from the light emitting diode(s). This can be done immediately after the above-mentioned steps (a)-(c). Alternatively, the produced porous ceramic elements are stored for a time before arranging them on an LED.

Figure 5A:
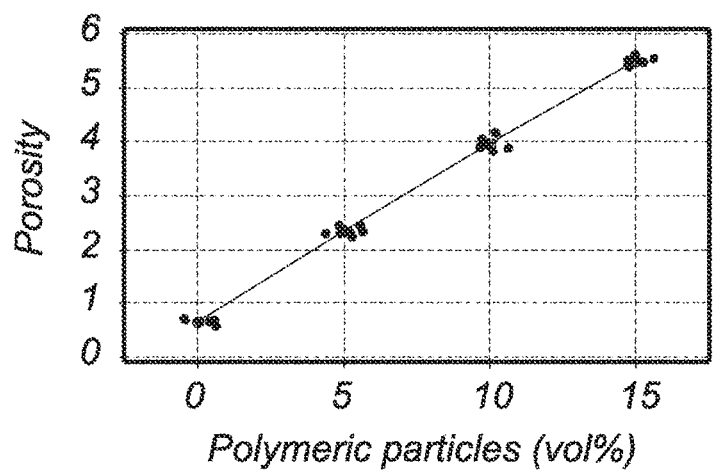
FIG. 5a illustrates the porosity of a ceramic porous element dependent on the concentration of polymeric particles.
Figure 5B:
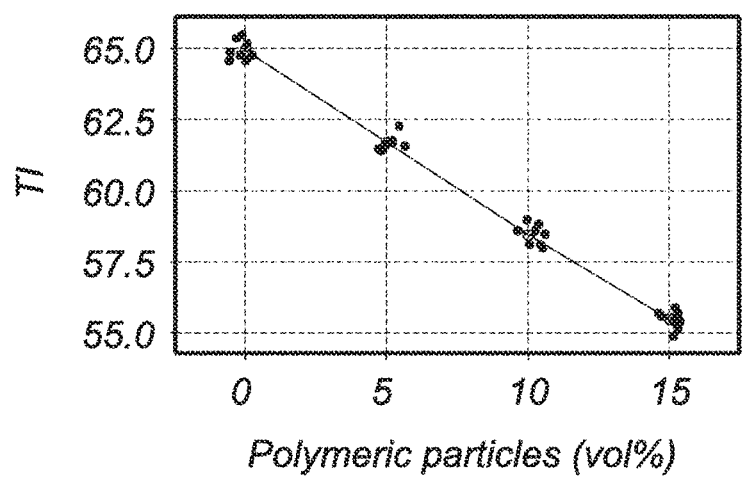
FIG. 5b illustrates the transmission of a ceramic porous element dependent on the concentration of polymeric particles

Referring to FIGS. 5a and 5b, the porosity, and hence also the transmission of the porous ceramic element is dependent on the amount of polymeric particles added. The graphs of FIGS. 5a and 5b illustrate that the porosity may be exactly tuned and controlled by the weighing out recipe for the amount of templates used.

The wavelength converting element is arranged to receive light from the LED, typically by means of a bonding layer, as is commonly known to those skilled in the art. In a further aspect of the present invention, a method for the manufacture of a ceramic element is provided. Such a method comprises:
    providing a slurry comprising ceramic particles of at least one wavelength converting material and polymeric particles having a diameter of from 2 µm to 10 µm;
    forming a ceramic body from said slurry; and
    removing said polymeric particles from said ceramic body to provide a porous ceramic element having an average pore diameter of from 2 µm to 10 µm.

To summarize, the present invention relates to a light emitting device comprising at least one light emitting diode and at least one porous ceramic element, which ceramic element is arranged to receive light from the light emitting diode(s). The present invention also relates to methods for the manufacture of the light emitting device and of the porous ceramic element.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims. For example, the present invention is not limited to the use of blue LEDs. In addition, other types of LEDs with different color and wavelength combinations may be used.

In addition, the wavelength converting element is not limited to the application to a specific LED type, but can be applied to all types of LEDs available.

The method of manufacturing the wavelength converting elements from a wafer comprising wavelength converting material is not restricted by a specific wafer thickness or size, but can be varied for different applications.

Further, a single wavelength converting element may be arranged on several light emitting diodes, for converting the light from more than one LED.

The invention claimed is:

1. A method for the manufacture of a light emitting device comprising:
    providing a slurry comprising ceramic particles of at least one wavelength converting material and polymeric particles having a diameter of from 2 µm to 10 µm;
    forming a ceramic body from said slurry;
    removing said polymeric particles from said ceramic body to provide a porous ceramic element having an average pore diameter of from 2 µm to 10 µm; and
    arranging said porous ceramic element to receive light from at least one light emitting diode.

2. A method according to claim 1, wherein said ceramic particles have an average particle size of from 5 µm to 10 µm.

3. A method according to claim 1, wherein said polymeric particles have an average diameter of from 2 µm to 5 µm.

4. A method according to claim 1, wherein said polymeric particles comprise polystyrene or polyacrylate.

5. A method according to claim 1, further comprising subjecting said porous ceramic element to a thermal treatment at a temperature above 1000° C.

6. A method according to claim 1, wherein removing said polymeric particles from said ceramic body comprises applying a thermal treatment such that the polymeric particles are decomposed or oxidized.

7. A method according to claim 1, wherein forming a ceramic body from said slurry comprises one of pressing, slip casting, tape casting, roller pressing, extruding, and injection molding.

8. A method according to claim 1, wherein the porous ceramic element is self-supporting.

9. A method according to claim 1, wherein the at least one light emitting diode is a blue light emitting LED and the porous ceramic element is adapted to absorb blue light, while emitting yellow light.

10. A method according to claim 2, wherein said polymeric particles are removed by subjecting said ceramic body to a thermal treatment at a temperature up to 1000° C.

11. A method according to claim 10, wherein during said thermal treatment, the ceramic body is sintered such that the ceramic particles are fused together.

12. A method for the manufacture of a porous ceramic element comprising:
- providing a slurry comprising ceramic particles of at least one wavelength converting material and polymeric particles having a diameter of from 2 μm to 10 μm;
- forming a ceramic body from said slurry; and
- removing said polymeric particles from said ceramic body to provide a porous ceramic element having an average pore diameter of from 2 μm to 10 μm.

* * * * *